United States Patent
Lee et al.

(10) Patent No.: US 6,636,424 B2
(45) Date of Patent: *Oct. 21, 2003

(54) HEAT DISSIPATION DEVICE

(75) Inventors: Hsieh Kun Lee, Taipei (TW); Donyun Lee, Shenzhen (CN)

(73) Assignee: Foxconn Precision Components, Co., Ltd., Taipei Hsien (TW)

(*) Notice: Subject to any disclaimer, the term of this patent is extended or adjusted under 35 U.S.C. 154(b) by 0 days.

This patent is subject to a terminal disclaimer.

(21) Appl. No.: 10/012,094

(22) Filed: Dec. 5, 2001

(65) Prior Publication Data

US 2003/0103331 A1 Jun. 5, 2003

(51) Int. Cl.[7] .................................................. H05K 7/20
(52) U.S. Cl. .......................... 361/705; 24/457; 257/719
(58) Field of Search .......................... 174/16.3; 439/485, 439/487; 165/80.3, 185; 257/718, 719, 726, 727; 24/453, 457, 458, 625; 248/505, 510; 361/687, 703, 704, 705, 717–719, 720

(56) References Cited

U.S. PATENT DOCUMENTS

| 5,734,554 | A | * | 3/1998 | Mitty et al. ................. 361/697 |
| 5,953,212 | A | * | 9/1999 | Lee ............................. 361/709 |
| 5,969,950 | A | * | 10/1999 | Tantoush ..................... 361/704 |
| 6,082,440 | A | * | 7/2000 | Clemens et al. ........... 165/80.3 |
| 6,311,765 | B1 | * | 11/2001 | Lo et al. .................... 165/80.3 |
| 6,373,701 | B1 | * | 4/2002 | Lo ............................... 361/704 |
| 6,449,157 | B1 | * | 9/2002 | Chu |

* cited by examiner

*Primary Examiner*—Gerald Tolin
(74) *Attorney, Agent, or Firm*—Wei Te Chung

(57) ABSTRACT

A heat dissipation device includes a heat sink (30), a metal plate (50), and a clip (20). The heat sink has a chassis (36) with thermally conductive material (40) applied thereunder. The metal plate is attached to the material in order to be in thermal contact with the chassis. The metal plate is then directly attached to a CPU (60). The clip is engaged with a socket (70) that supports the CPU, to facilitate the metal plate intimately contacting the CPU. The metal plate prevents the CPU from moving from the socket should the heat dissipation device be accidentally moved or displaced. This reduces any risk of damage to the CPU. In addition, heat generated from the CPU is efficiently removed.

5 Claims, 2 Drawing Sheets

HEAT DISSIPATION DEVICE

BACKGROUND OF THE INVENTION

1. Field of the Invention

The present invention relates to heat dissipation devices, and more particularly to heat dissipation devices which can be safely attached to heat-generating devices and which have great heat removal capability.

2. Description of Related Art

Most computer central processing units (CPUs) are secured to a mother board in a zero inserted force (ZIF) socket. To ensure normal operation of a CPU, a heat dissipation device is attached to a top surface of the CPU to remove heat generated therefrom.

A common heat dissipation device for a CPU comprises a heat sink and a clip. The clip spans across the heat sink, and is engaged with a socket. A bottom surface of the heat sink is attached on a top surface of the CPU. A thermally conductive material is applied to the bottom surface of the heat sink. The material fills gaps between the heat sink and the CPU, to enhance thermal conductivity between the heat sink and the CPU. This gives the heat dissipation device greater heat removal capability.

However, the material applied to the bottom surface of the heat dissipation device is sticky, and is in direct contact with the top surface of the CPU. The material may bind the CPU and the heat sink together. When this happens, and if the heat dissipation device is accidentally moved or displaced, the heat dissipation device can easily pull the CPU out from the ZIF socket. This frequently occurs when the mother board is subjected to shock or vibration. The CPU is liable to be damaged when it is accidentally pulled out from the socket.

SUMMARY OF THE INVENTION

Accordingly, an object of the present invention is to provide a heat dissipation device which protects a CPU from being removing from a CPU socket when force is unintentionally exerted on a heat sink of the heat dissipation device that is in thermal contact with the CPU.

In order to achieve the object set out above, a heat dissipation device comprises a heat sink, a metal plate and a clip. The heat sink has a chassis with thermally conductive material applied thereunder. The metal plate is attached to the material in order to be in thermal contact with the chassis. The metal plate is then directly attached to a CPU. The clip is engaged with a socket that supports the CPU, to facilitate the metal plate intimately contacting the CPU. The metal plate prevents the CPU from moving from the socket should the heat dissipation device be accidentally moved or displaced. This reduces any risk of damage to the CPU. In addition, heat generated from the CPU is efficiently removed.

Other objects, advantages and novel features of the present invention will become more apparent from the following detailed description when taken in conjunction with the accompanying drawings.

DETAILED DESCRIPTION OF THE INVENTION

Figure 1:
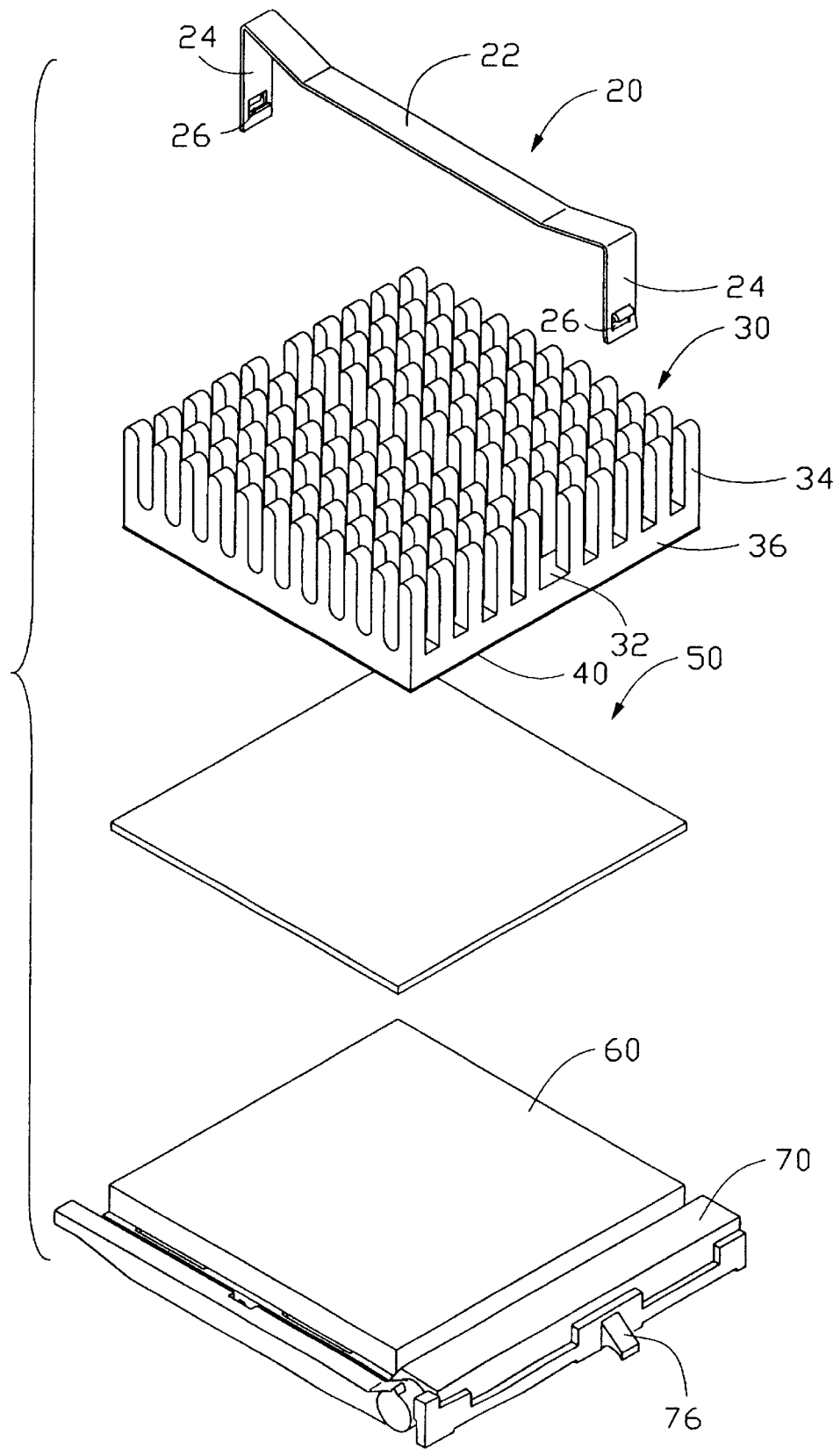
FIG. 1 is an exploded view of a heat dissipation device in accordance with the present invention, together with a CPU mounted on a socket.

Reference will now be made to the drawing figures to describe the preferred embodiment of the present invention in detail.

Referring to FIG. 1, a heat dissipation device in accordance with a preferred embodiment of the present invention comprises a clip 20, a heat sink 30 and a thin metal plate 50. The heat dissipation device removes heat from a CPU 60 mounted on a socket 70. A pair of catches 76 is formed at opposite sides of the socket 70 to engage with the clip 20, thereby intimately attaching the heat dissipation device to the CPU 60.

The heat sink 30 comprises a chassis 36, and a plurality of fins 34 extending upwardly from the chassis 36. A central groove 32 is defined through the fins 34, from one side of the heat sink 30 through an opposite side of the heat sink 30. Material 40 having great thermal conductivity is for applying to a bottom surface of the heat sink 30. The material 40 may be thermal grease or another suitable material.

The metal plate 50 is attached to the material 40. The metal plate 50 has great thermal conductivity and plasticity. In the preferred embodiment, the metal plate 50 has a thickness between 0.10 mm and 0.13 mm.

The clip 20 is formed from a metal strip. The clip 20 comprises a shoulder 22 for being received in the groove 32 and pressing the heat sink 30, and a pair of arms 24 depending from opposite ends of the shoulder 22 respectively. Each arm 24 defines an aperture 26 therein, for engaging with a corresponding catch 76 of the socket 70.

Figure 2:
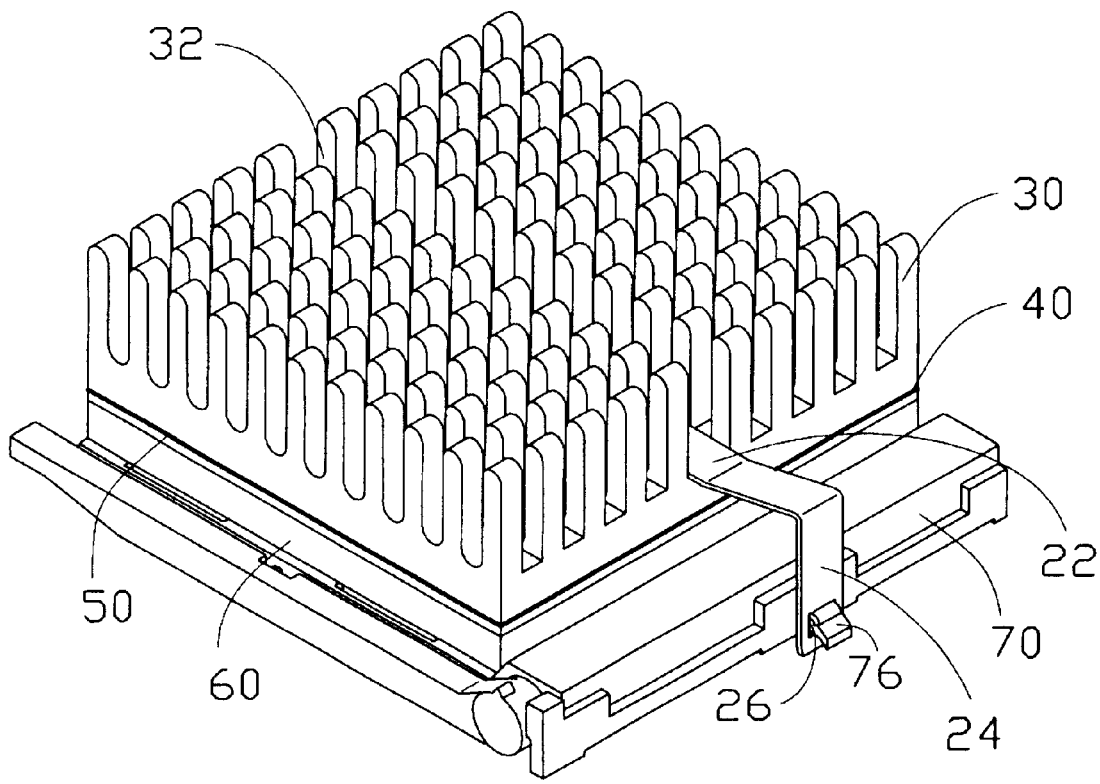
FIG. 2 is an assembled view of FIG. 1.

Also referring to FIG. 2, in assembly of the heat dissipation device, the material 40 is applied to the bottom surface of the chassis 36. The metal plate 50 is attached to the material 40, and substantially covers the material 40. The metal plate 50 is in effective thermal contact with the chassis 36 of the heat sink 30. The clip 20 is loosely received in the groove 32 of the heat sink 30, and spans the heat sink 30.

In use of the heat dissipation device, the combined heat sink 30 and metal plate 50 is placed onto a top surface of the CPU 60. The catches 76 of the socket 70 are engaged in the apertures 26 of the clip 20. Thus, the heat dissipation device is intimately attached to the CPU 60 for removing heat therefrom.

The metal plate 50 of the present invention prevents the CPU 60 from having direct contact with the material 40. The metal plate 50 also prevents the CPU 60 from moving from the socket 70 should the heat dissipation device be accidentally moved or displaced. This reduces any risk of damage to the CPU 60. The metal plate 50 has great thermal conductive and plasticity. Thus, the metal plate 50 intimately contacts the CPU 60 under pressure from the clip 20. This enables the heat dissipation device to efficiently remove heat from the CPU 60.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device assembly comprising:
    a heat sink comprising a chassis having a material applied thereunder, the material having great thermal conductivity;
    a metal plate attached under the chassis of the heat sink and covering the material, the metal plate having great thermal conductivity and plasticity and having a thickness substantially between 0.10 millimeters and 0.13 millimeters, the metal plate directly contacting a CPU and preventing the CPU from having direct contact with the material; and a clip rested on the chassis and pressing the heat sink and the metal plate toward the CPU such that the metal plate is in intimate thermal contact with the CPU.

2. The heat dissipation device assembly as recited in claim 1, wherein the material is applied to a bottom surface of chassis.

3. The heat dissipation device assembly as recited in claim 1, wherein the heat sink defines a groove over the chassis, the groove receiving the clip therein.

4. The heat dissipation device assembly as recited in claim 1, wherein the clip is formed from a metal strip.

5. A heat sink assembly consisting of:

an electronic package defining a contact area on an upper surface thereof;

a heat sink having a chassis with a plurality of fins extending from a top surface of the chassis; and a metal plate having great thermal conductivity and plasticity thereof and having a thickness substantially between 0.10 millimeters and 0.13 millimeters; wherein said metal plate is located under a bottom surface of the chassis and downwardly urged by the heat sink, and thus directly contacts and presses downwardly against the upper surface of the electronic package.

* * * * *